(12) United States Patent
Joshi et al.

(10) Patent No.: US 12,260,187 B2
(45) Date of Patent: Mar. 25, 2025

(54) LINEAR APPROXIMATION OF A COMPLEX NUMBER MAGNITUDE

(71) Applicant: TEXAS INSTRUMENTS INCORPORATED, Dallas, TX (US)

(72) Inventors: Shailesh Joshi, Bangalore (IN); Karthik Subburaj, Bangalore (IN); Karthik Ramasubramanian, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 743 days.

(21) Appl. No.: 17/357,919

(22) Filed: Jun. 24, 2021

(65) Prior Publication Data
US 2022/0366004 A1    Nov. 17, 2022

(30) Foreign Application Priority Data
May 12, 2021   (IN) .............................. 202141021448

(51) Int. Cl.
G06F 7/48     (2006.01)
G06F 17/14    (2006.01)
H03K 5/24     (2006.01)

(52) U.S. Cl.
CPC .......... *G06F 7/4806* (2013.01); *G06F 17/142* (2013.01); *H03K 5/24* (2013.01)

(58) Field of Classification Search
CPC .................................................. G06F 7/4806
(Continued)

(56) References Cited

U.S. PATENT DOCUMENTS

| | | | | |
|---|---|---|---|---|
| 4,599,701 A | * | 7/1986 | Vojir ....................... | G06F 7/552 708/605 |
| 5,459,681 A | * | 10/1995 | Harrison .................. | G06F 7/57 708/201 |
| 5,958,002 A | * | 9/1999 | Zhou ....................... | G06G 7/22 708/835 |

FOREIGN PATENT DOCUMENTS

WO    WO-0211119 A2 *   2/2002   ............. G10L 15/02

OTHER PUBLICATIONS

Serra, Xavier, and Julius Smith. "Spectral Modeling Synthesis: A Sound Analysis/Synthesis System Based on a Deterministic Plus Stochastic Decomposition." Computer Music Journal, vol. 14, No. 4, 1990, pp. 12-24, https://doi.org/10.2307/3680788. (Year: 1990).*

(Continued)

*Primary Examiner* — Emily E Larocque
*Assistant Examiner* — Markus Anthony Villanueva
(74) *Attorney, Agent, or Firm* — Michael T. Gabrik; Frank D. Cimino

(57) ABSTRACT

A device includes a comparison circuit and a calculation circuit coupled to the comparison circuit. The comparison circuit is configured to receive a first digital input value (X) and a second digital input value (Y), and provide a first digital output value that indicates one of a first relationship, a second relationship, and a third relationship between X and Y. The calculation circuit is configured to receive X and Y, receive the first digital output value, and provide a second digital output value. The second digital output value is a first linear combination of X and Y responsive to the first digital output value indicating the first relationship, a second linear combination of X and Y responsive to the first digital output value indicating the second relationship, and a third linear combination of X and Y responsive to the first digital output value indicating the third relationship.

19 Claims, 4 Drawing Sheets

(58) Field of Classification Search
USPC .......................................................... 708/201
See application file for complete search history.

(56) References Cited

OTHER PUBLICATIONS

Levitt et al., "An Improved Digital Algorithm for Fast Amplitude Approximations of Quadrature Pairs," DSN Progress Report 42-40, May and Jun. 1977, pp. 97-101.

* cited by examiner

LINEAR APPROXIMATION OF A COMPLEX NUMBER MAGNITUDE

CROSS-REFERENCE TO RELATED APPLICATIONS

The present application claims priority to Indian Provisional Patent Application No. 202141021448, which was filed May 12, 2021, is titled "Linear Approximation Of A Complex Number Magnitude," and is hereby incorporated herein by reference in its entirety.

SUMMARY

In accordance with at least one example of the disclosure, a device includes a comparison circuit and a calculation circuit coupled to the comparison circuit. The comparison circuit is configured to receive a first digital input value (X) and a second digital input value (Y), and provide a first digital output value that indicates one of a first relationship, a second relationship, and a third relationship between X and Y. The calculation circuit is configured to receive X and Y, receive the first digital output value, and provide a second digital output value. The second digital output value is a first linear combination of X and Y responsive to the first digital output value indicating the first relationship, a second linear combination of X and Y responsive to the first digital output value indicating the second relationship, and a third linear combination of X and Y responsive to the first digital output value indicating the third relationship.

In accordance with another example of the disclosure, a method includes receiving a first digital input value (X) and a second digital input value (Y); determining a first digital output value that indicates one of a first relationship, a second relationship, and a third relationship between X and Y; and providing a second digital output value. The second digital output value is a first linear combination of X and Y responsive to the first digital output value indicating the first relationship, a second linear combination of X and Y responsive to the first digital output value indicating the second relationship, or a third linear combination of X and Y responsive to the first digital output value indicating the third relationship.

In accordance with yet another example of the disclosure, a non-transitory, computer-readable medium contains instructions that, when executed by a processor, cause the processor to be configured to receive a first digital input value (X) and a second digital input value (Y); determine a first digital output value that indicates one of a first relationship, a second relationship, and a third relationship between X and Y; and provide a second digital output value. The second digital output value is a first linear combination of X and Y responsive to the first digital output value indicating the first relationship, a second linear combination of X and Y responsive to the first digital output value indicating the second relationship, or a third linear combination of X and Y responsive to the first digital output value indicating the third relationship.

BRIEF DESCRIPTION OF THE DRAWINGS

For a detailed description of various examples, reference will now be made to the accompanying drawings in which.

DETAILED DESCRIPTION

Figure 1:
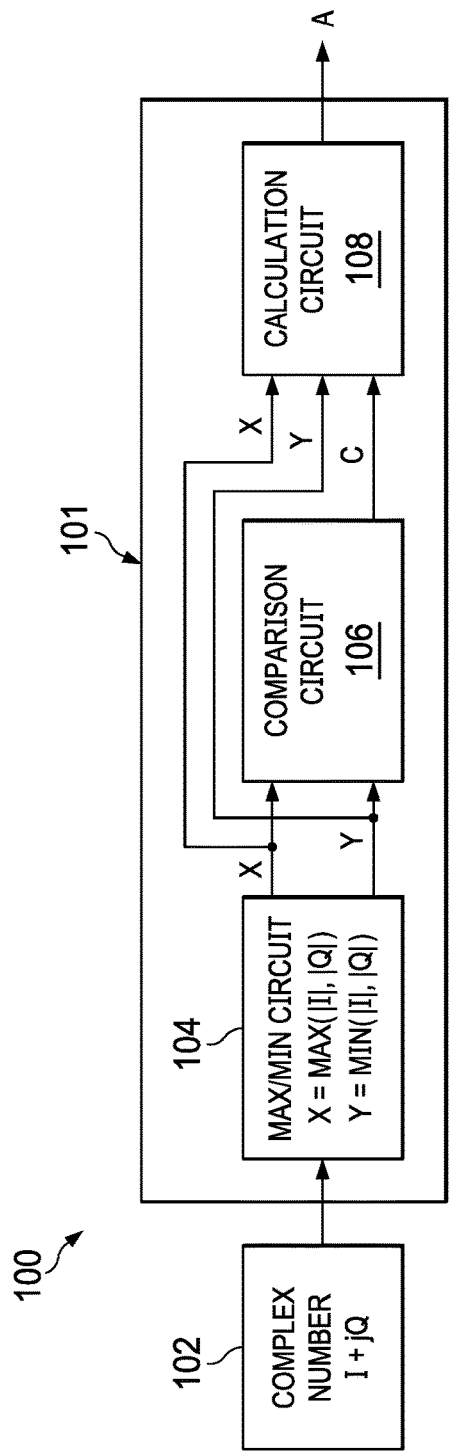
FIG. 1 is a block diagram of a system for approximating a magnitude of a complex number in accordance with various examples.

The magnitude of a complex number is a useful value in various applications. For example, the magnitude of a complex number is useful to determine the magnitude of complex digital signals, such as a fast Fourier transform (FFT) magnitude response in applications including radar signal processing and communications signal processing.

The magnitude of a complex number is calculated by taking the square root of the sum of the squares of the real and imaginary parts of the complex number. However, squaring and square root computations are time- and area-intensive. In some cases, the magnitude of a complex number can be approximated using a linear combination of the real and imaginary parts of the complex number. However, this approximation introduces an error to the determination of the magnitude of a complex number, which can reduce performance of the application that uses the magnitude of a complex number. In some cases, such as in a baseband system (e.g., radar processors and/or wireless communication receivers), an inaccurate approximation of the magnitude of a complex number results in a decreased signal-to-noise ratio (SNR), which reduces the accuracy of detection and/or communication speed of the system.

Examples of this description address the foregoing by providing an approximation of the magnitude of a complex number. In some examples, a hardware circuit provides the approximation of the magnitude of a complex number, while in other examples, firmware or software is executed by a hardware processor to provide the approximation of the magnitude of a complex number. Regardless of the specific implementation, the approximation of the magnitude of a complex number has a reduced error relative to existing methods, while maintaining an acceptable amount of latency (e.g., less than a latency threshold for a particular application).

In particular, one example includes a device that has a comparison circuit and a calculation circuit. The comparison circuit receives first and second digital input values, each of which represents one of the real and imaginary parts of a complex number. The comparison circuit provides a comparison output (e.g., a first digital output value) that indicates whether a relationship between the first and second digital input values is a first relationship, a second relationship, or a third relationship. In other examples, the comparison output indicates whether a relationship between first and second digital input values is one of more than three relationships.

The calculation circuit receives the comparison output as well as the first and second digital input values also provided to the comparison circuit. The calculation circuit provides an approximation of the magnitude of the complex number (e.g., a second digital output value) responsive to the digital input values and the comparison output.

For example, responsive to the comparison output indicating that the relationship between the digital input values is the first relationship, the calculation circuit provides a first linear combination of the digital input values as the approximation of the magnitude of the complex number. Responsive to the comparison output indicating that the relationship between the digital input values is the second relationship, the calculation circuit provides a second linear combination of the digital input values as the approximation of the magnitude of the complex number. Finally, responsive to the comparison output indicating that the relationship between the digital input values is the third relationship, the calculation circuit provides a third linear combination of the digital input values as the approximation of the magnitude of the complex number. In other examples, in which the comparison output indicates that the relationship between the digital input values is one of more than three relationships, the calculation circuit provides additional linear combinations of the digital input values as the approximation of the magnitude of the complex number for the additional identified relationships, respectively.

In other examples, the functionality of the comparison circuit and the calculation circuit is implemented by the execution by a hardware processor of firmware or software (e.g., stored on a non-transitory computer-readable medium) that causes the hardware processor to provide such functionality. These examples are described further below.

FIG. 1 is a block diagram of a system 100 in accordance with examples of this description. The system 100 includes a device 101 that receives a complex number 102 as input. The complex number 102 has the form I+jQ, where I represents a magnitude of a real part of the complex number 102 and Q represents a magnitude of an imaginary part of the complex number 102. Both I and Q can be positive, negative, or zero values.

As described above, in various applications, it is useful to determine a magnitude of the complex number 102. Thus, the complex number 102 is provided to the device 101, which is configured to provide an approximation (A) of the magnitude of the complex number 102 responsive to receiving the complex number 102. In one example, the system 100 is an FFT computation engine 100, and thus the device 101 is part of the FFT computation engine 100. In this example, the device 101 provides the approximation (A) of the magnitude of a complex number 102, such as to compute a magnitude of an FFT spectrum. In another example, the system 100 is a radar system 100, and thus the device 101 is part of the radar system 100. In this example, the device 101 provides the approximation (A) of the magnitude of a complex number 102, which is useful in performing various radar operations, such as peak detection operations (e.g., constant false alarm rate (CFAR) detection) to determine the location and/or velocity of an object observed by the radar system 100.

The device 101 includes a max/min circuit (which may alternatively be an absolute value comparison circuit) 104, a comparison circuit 106, and a calculation circuit 108. The circuits 104, 106, 108 are depicted separately for ease of reference to the individual functions of each circuit 104, 106, 108. However, in some examples, the underlying hardware of the circuits 104, 106, 108 is part of a single integrated circuit (IC) or a portion thereof.

The max/min circuit (or absolute value comparison circuit) 104 receives the complex number 102 and provides as output a first digital value (X) and a second digital value (Y). In one example, the complex number 102 is provided to the max/min circuit 104 as two signed digital values representing I and Q, respectively. However, in other examples, the complex number 102 is provided to the device 101 in another format and the device 101 includes additional circuitry to convert the complex number 102 from the other format to two signed digital values representing I and Q, respectively, to be provided to the max/min circuit 104.

Regardless of the format in which the complex number 102 is provided to the max/min circuit 104, the max/min circuit 104 is configured to provide digital values X and Y responsive to receiving the complex number 102. In examples of this description, X is the maximum of the absolute values of I and Q, and Y is the minimum of the absolute values of I and Q. For example, X is the larger of the absolute values of I and Q, and Y is the smaller of the absolute values of I and Q. In cases where the absolute values of I and Q are equal, X and Y are also equal.

Applying the absolute value operation to the real and imaginary parts I and Q of the complex number 102 effectively transforms the representation of the complex number 102 into the first quadrant of the complex plane. For example, a complex number 102 in the second quadrant (e.g., I is negative, Q is positive) is transformed into the first quadrant because the absolute value of −I is I. Similarly, a complex number 102 in the third quadrant (e.g., I and Q are both negative) is transformed into the first quadrant because the absolute value of −I is I while the absolute value of −Q is Q. Finally, a complex number 102 in the fourth quadrant (e.g., I is positive, Q is negative) is transformed into the first quadrant because the absolute value of −Q is Q. Further, selecting X and Y as the maximum and minimum, respectively, of the absolute values of I and Q of the complex number 102 effectively transforms the representation of the complex number 102 into the first 45 degrees of the first quadrant of the complex plane.

Figure 2:
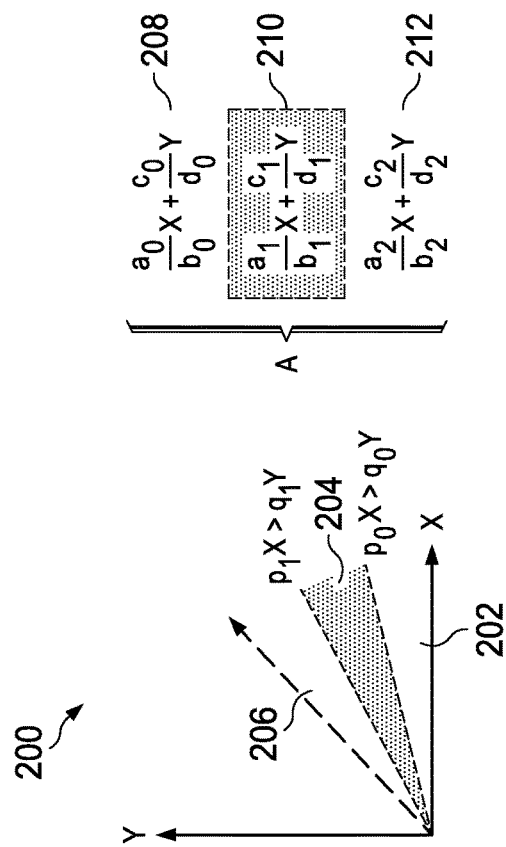
FIG. 2 is a graph of a portion of a complex plane in accordance with various examples.

FIG. 2 is a graph 200 of the first quadrant of the complex plane, with axes labeled X and Y. As described above, because X and Y are the maximum and minimum, respectively, of the absolute values of I and Q of the complex number 102, all complex numbers 102 are transformed into (e.g., represented in) the first 45 degrees of the first quadrant of the complex plane. As described further below, a relationship between X and Y is determined to be a first relationship, a second relationship, or a third relationship. In other examples, the relationship between X and Y is determined to be one of more than three relationships.

In this example in which the determined relationship is one of three relationships, the first 45 degrees of the complex plane are divided into three regions 202, 204, 206 in which the coordinate pair input (X, Y) can be located. The relationship between X and Y is indicated by the validity of two inequality conditions, $p_0 X > q_0 Y$ and $p_1 X > q_1 Y$. Thus, the coordinate pair input (X, Y) is determined to be located in one of the three regions 202, 204, 206 based on the two conditions. For example, the first region 202 is selected responsive to the (X, Y) relationship satisfying the condition $p_0 X > q_0 Y$ (e.g., the (X, Y) relationship is a first relationship). The second region 204 is selected responsive to the (X, Y) relationship not satisfying the condition $p_0 X > q_0 Y$ and satisfying the condition $p_1 X > q_1 Y$ (e.g., the (X, Y) relationship is a second relationship). The third region 206 is selected responsive to the (X, Y) relationship not satisfying the condition $p_1 X > q_1 Y$ and not satisfying the condition $p_0 X > q_0 Y$ (e.g., the (X, Y) relationship is a third relationship).

Depending on the selected region 202, 204, 206, one of three linear combinations 208, 210 and 212, is selected as the formula to generate the output of the algorithm. As described further below, responsive to the relationship between X and Y being the first relationship (e.g., the values of X and Y are in the first region 202), the magnitude of the complex number 102 is approximated by a first linear combination 208 of X and Y. Responsive to the relationship between X and Y being the second relationship (e.g., the values of X and Y are in the second region 204), the magnitude of the complex number 102 is approximated by a second linear combination 210 of X and Y. Responsive to the relationship between X and Y being the third relationship (e.g., the values of X and Y are in the third region 206), the magnitude of the complex number 102 is approximated by a third linear combination 212 of X and Y.

Referring back to FIG. 1, responsive to receiving the complex number 102, the max/min circuit 104 provides X and Y to the comparison circuit 106. The comparison circuit 106 is configured to provide a comparison output C (e.g., a first digital output value) that indicates whether a relationship between X and Y values is a first relationship, a second relationship, or a third relationship. For example, C is at least a 2-bit value that specifies the relationship between X and Y. In other examples, C specifies one of more than three relationships between X and Y.

The calculation circuit 108 receives the comparison output C from the comparison circuit 106 as well as X and Y from the max/min circuit 104. The calculation circuit 108 is configured to provide an approximation (A) of the magnitude of the complex number 102 (e.g., a second digital output value) responsive to X, Y, and C. For example, responsive to C indicating that the relationship between X and Y is the first relationship (e.g., corresponding to the first region 202), the calculation circuit 108 provides a first linear combination 208 of X and Y as the approximation A. Responsive to C indicating that the relationship between X and Y is the second relationship (e.g., corresponding to the second region 204), the calculation circuit 108 provides a second linear combination 210 of X and Y as the approximation A. Finally, responsive to C indicating that the relationship between X and Y is the third relationship (e.g., corresponding to the third region 206), the calculation circuit 108 provides a third linear combination 212 of X and Y as the approximation A. In other examples, in which the C indicates that the relationship between X and Y is one of more than three relationships, the calculation circuit 108 provides additional linear combinations of X and Y as the approximation A.

In accordance with certain examples of this description, the first relationship corresponds to X being greater than 4Y, the second relationship corresponds to X being less than or equal to 4Y and 3X being greater than 5Y, and the third relationship corresponds to 3X being less than or equal to 5Y. Continuing this example, the linear combinations 208, 210, 212 of X and Y are given by the following system of equations:

$$\frac{1}{1}X + \frac{13}{128}Y \quad X > 4Y$$
$$\frac{119X + 49Y}{128} \quad X <= 4Y \,\&\, 3X > 5Y$$
$$\frac{119X + 49Y}{128} \quad 3X <= 5Y$$

In other examples of this description, the first, second, and third relationships are different than those shown above. Additionally, in other examples of this description, the linear combinations 208, 210, 212 are different than those described above.

Figure 3:
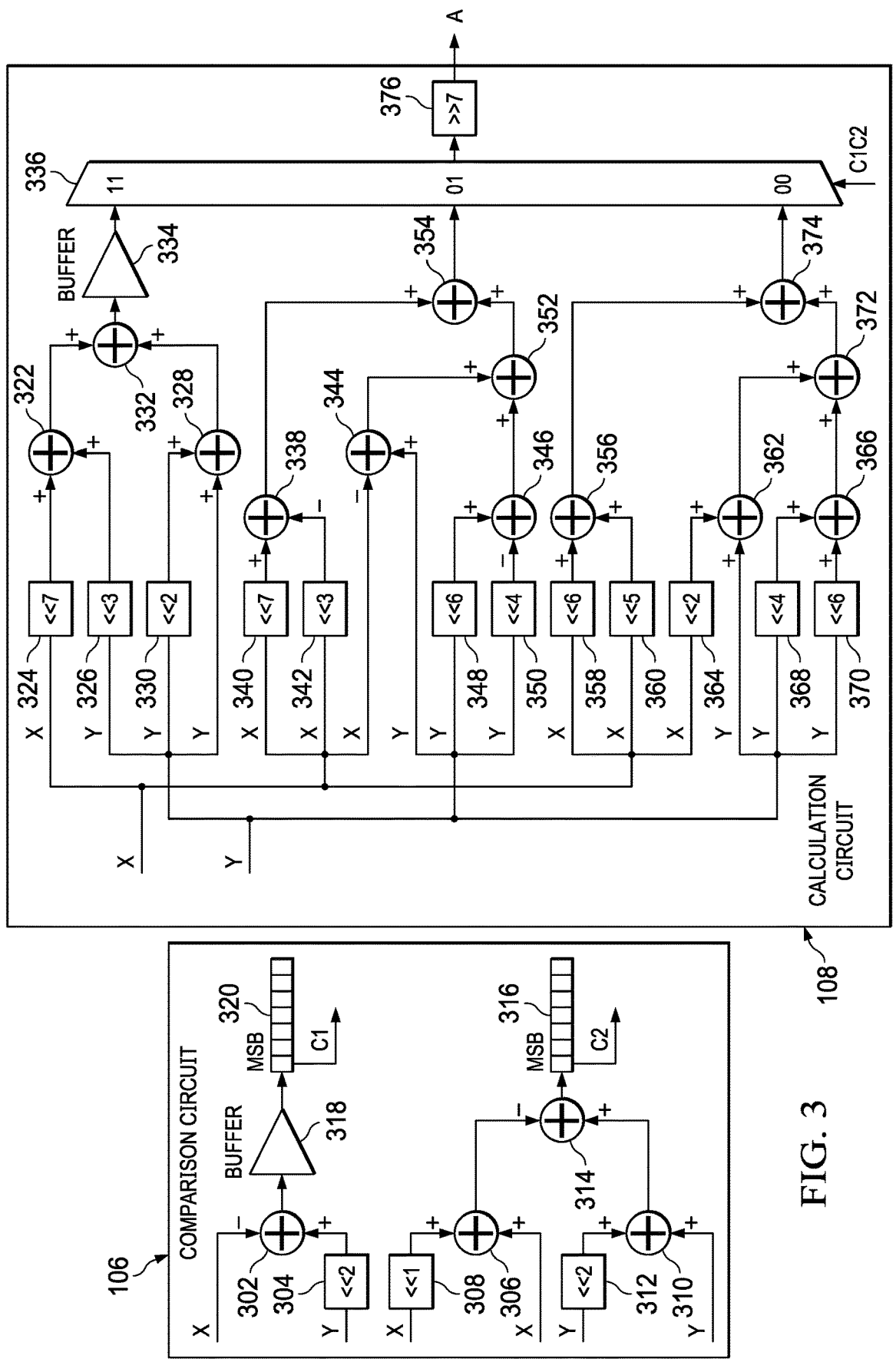
FIG. 3 is a schematic diagram of a comparison circuit and a calculation circuit of the system in FIG. 1 in accordance with various examples.

FIG. 3 is an example circuit schematic of the comparison circuit 106 and the calculation circuit 108 described above. As described above, both the comparison circuit 106 and the calculation circuit 108 receive X and Y as inputs. Additionally, the comparison circuit 106 provides the comparison output C that specifies the relationship between X and Y. In the example of FIG. 3, the comparison output C is a 2-bit value including a first bit C1 and a second bit C2. In the example of FIG. 3, both the comparison circuit 106 and the calculation circuit 108 include various digital adders and digital shifters as described below. For simplicity, digital adders are referred to as adders regardless of whether they perform an addition or subtraction operation. Further, digital shifters implement multiplication (e.g., by shifting a digital value left) or division (e.g., by shifting a digital value right).

The comparison circuit 106 includes an adder 302 that is configured to receive X and 4Y (e.g., an output of shifter 304, which shifts Y to the left by 2), and to provide a digital output value that is equal to 4Y−X.

The comparison circuit 106 also includes an adder 306 that is configured to receive 2X (e.g., an output of shifter 308, which shifts X to the left by 1 bit) and X, and to provide a digital output value that is equal to 2X+X, or 3X. An adder 310 is configured to receive 4Y (e.g., an output of shifter 312, which shifts Y to the left by 2 bits) and Y, and to provide a digital output value that is equal to 4Y+Y, or 5Y. An adder 314 is configured to receive the outputs from the adders 306 and 310, and to provide a digital output value that is equal to 5−3X.

The output of the adder 314 (e.g., 5Y−3X) is provided to a first digital buffer 316, the most significant bit of which is the second bit C2 of the comparison output C of the comparison circuit 106. The output of the adder 302 (e.g., 4Y−X) is provided to a delay buffer 318, such as to compensate for, or match, the delay introduced by the adder 314. An output of the delay buffer 318 is provided to a second digital buffer 320, the most significant bit of which is the first bit C1 of the comparison output C of the comparison circuit 106.

Thus, in the example of FIG. 3, C1 is 1 responsive to X being greater than 4Y and C1 is 0 responsive to X being less than or equal to 4Y. Also, in the example of FIG. 3, C2 is 1 responsive to 3X being greater than or equal to 5Y and C2 is 0 responsive to 3X being less than 5Y. Accordingly, C is 11 responsive to the relationship between X and Y being the first relationship, 01 responsive to the relationship between X and Y being the second relationship, or 00 responsive to the relationship between X and Y being the third relationship.

The calculation circuit 108 includes an adder 322 that is configured to receive 128X (e.g., an output of shifter 324, which shifts X to the left by 7 bits) and 8Y (e.g., an output of shifter 326, which shifts Y to the left by 3 bits), and to provide a digital output value that is equal to 128X+8Y.

An adder 328 is configured to receive 4Y (e.g., an output of shifter 330, which shifts Y to the left by 2 bits) and Y, and to provide a digital output value that is equal to 4Y+Y, or 5Y.

An adder 332 is configured to receive the outputs from the adders 322 and 328, and to provide a digital output value equal to 128X+8Y+5Y, or 128X+13Y. The output of the adder 332 is provided to a delay buffer 334, such as to compensate for, or match, the delay introduced by an additional level of adders described below. An output of the delay buffer 334 is provided as a first input to a multiplexor (mux) 336.

The calculation circuit 108 also includes an adder 338 that is configured to receive 128X (e.g., an output of shifter 340, which shifts X to the left by 7 bits) and 8X (e.g., an output of shifter 342, which shifts X to the left by 3 bits), and to provide a digital output value that is equal to 128X−8X, or 120X.

An adder 344 is configured to receive X and Y, and to provide a digital output value that is equal to Y−X.

An adder 346 is configured to receive 64Y (e.g., an output of shifter 348, which shifts Y to the left by 6 bits) and 16Y (e.g., an output of shifter 350, which shifts Y to the left by 4 bits), and to provide a digital output value that is equal to 64Y−16Y, or 48Y.

An adder 352 is configured to receive the outputs from the adders 344 and 346, and to provide a digital output value that is equal to Y−X+48Y, or 49Y−X.

An adder 354 is configured to receive the outputs from the adders 338 and 352, and to provide a digital output value that is equal to 120X+49Y−X, or 119X+49Y. The output of the adder 354 is provided as a second input to the mux 336.

The calculation circuit 108 also includes an adder 356 that is configured to receive 64X (e.g., an output of shifter 358, which shifts X to the left by 6 bits) and 32X (e.g., an output of shifter 360, which shifts X to the left by 5 bits), and to provide a digital output value that is equal to 64X+32X, or 96X.

An adder 362 is configured to receive 4X (e.g., an output of shifter 364, which shifts X to the left by 2 bits) and Y, and to provide a digital output value that is equal to 4X+Y.

An adder 366 is configured to receive 16Y (e.g., an output of shifter 368, which shifts Y to the left by 4 bits) and 64Y (e.g., an output of shifter 370, which shifts Y to the left by 6 bits), and to provide a digital output value that is equal to 16Y+64Y, or 80Y.

An adder 372 is configured to receive the outputs from the adders 362 and 366, and to provide a digital output value that is equal to 4X+Y+80Y, or 4X+81Y.

An adder 374 is configured to receive the outputs from the adders 356 and 372, and to provide a digital output value that is equal to 96X+4X+81Y, or 100X+81Y. The output of the adder 374 is provided as a third input to the mux 336.

The comparison output C is provided as a control input to the mux 336. The mux 336 is configured to provide its first input (e.g., 128X+13Y) as a mux output responsive to C being 11, indicating the first relationship between X and Y. The mux 336 is configured to provide its second input (e.g., 119X+49Y) as the mux output responsive to C being 01, indicating the second relationship between X and Y. The mux 336 is configured to provide its third input (e.g., 100X+81Y) as the mux output responsive to C being 00, indicating the third relationship between X and Y. Regardless of the value of C, the mux output is provided to shifter 376, which divides the mux output by 128 (e.g., shifts the mux output to the right by 7 bits). The output of the shifter 376 is the approximation A of the magnitude of the complex number 102, which is one of a first, second, and third linear combination of X and Y responsive to the value of the comparison output C.

In other examples of this description, the comparison circuit 106 and the calculation circuit 108 are implemented using different logical and/or mathematical arrangements of the circuit schematic shown in FIG. 3. Such other example rearrangements are within the scope of this description.

Figure 4:
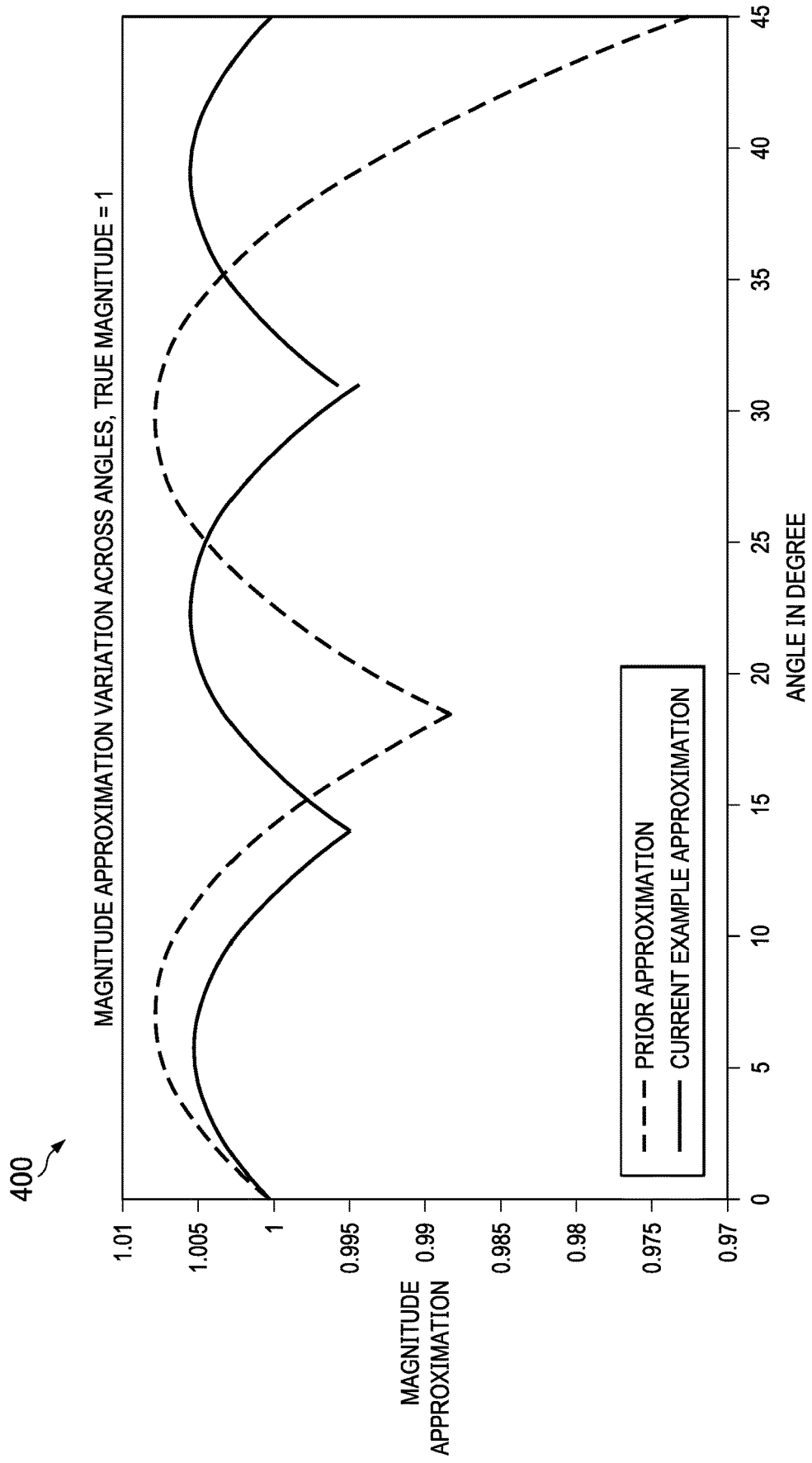
FIG. 4 is a graph of magnitude approximation accuracy as a function of angle in the portion of the complex plane in accordance with various examples.

The approximation A of the magnitude of the complex number 102 has a reduced error relative to existing methods, while maintaining an acceptable amount of latency (e.g., less than a latency threshold for a particular application). FIG. 4 is a graph 400 of magnitude approximation accuracy as a function of angle in the portion of the complex plane in accordance with various examples. The graph 400 includes an indication of accuracy for a prior approximation approach and for the examples described herein. A magnitude approximation accuracy of 1.0 corresponds to an error of 0.0%, while a magnitude approximation accuracy of 1.005 or 0.995 corresponds to an error of 0.5%, and so on. For example, although not shown in FIG. 4, an actual calculation of the magnitude of the complex number 102 (e.g., by taking the square root of the sum of the squares of the real and imaginary parts of the complex number 102) would have a magnitude approximation accuracy of 1.0 for all angles, which corresponds to an error of 0.0%.

One prior approximation approach, which segments the complex plane between 0 and 45 degrees in two segments, has an error of about 2.7%. This amount of error may be higher than is tolerable in certain applications. By contrast, the examples of this description divide the complex plane between 0 and 45 degrees in three segments based on the first, second, and third relationships between X and Y described above. The examples describe herein have an error of about 0.584%, while using 16 2-input adders with a maximum adder depth (e.g., latency) of 3, as shown in FIG. 3.

Figure 5:
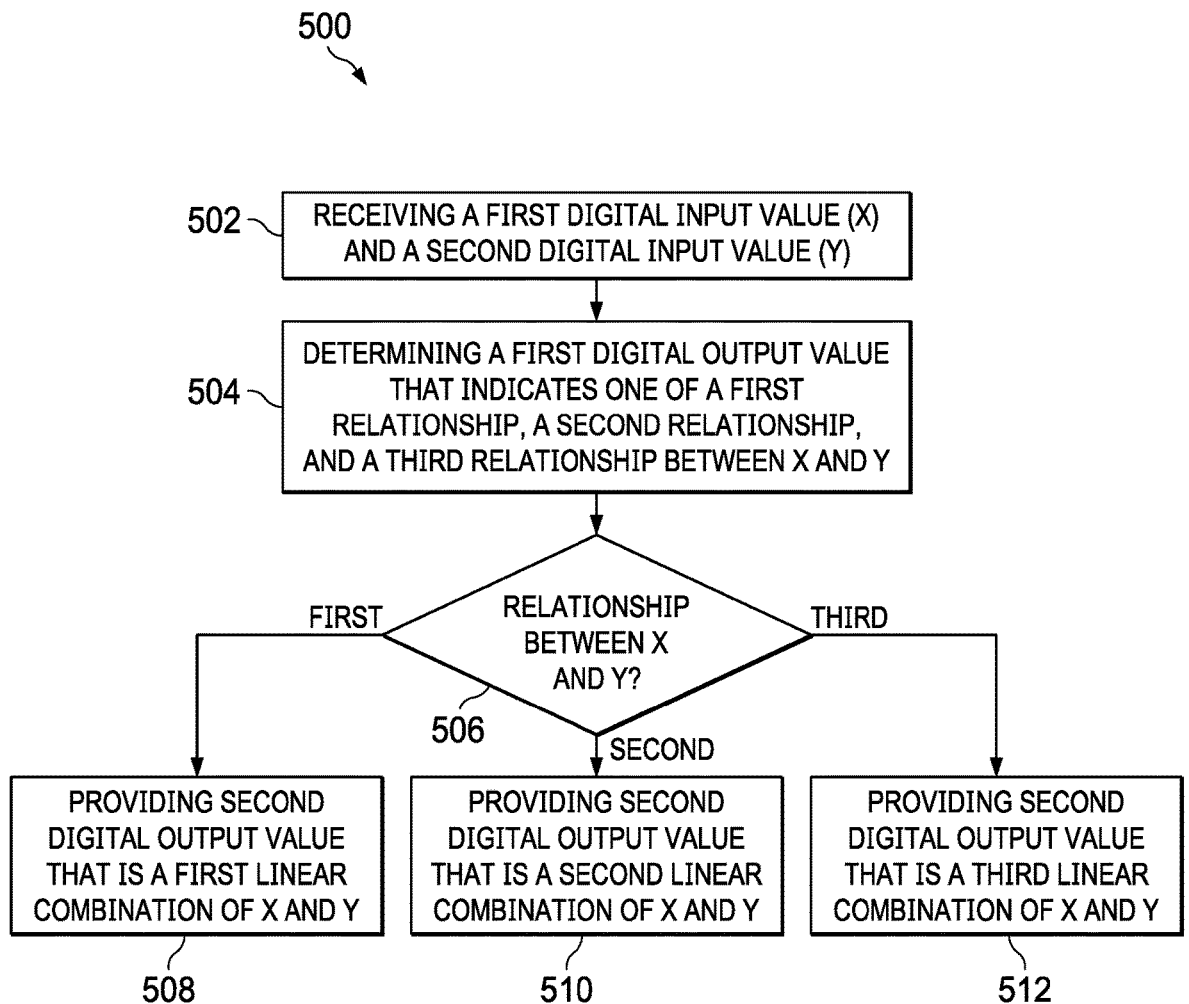
FIG. 5 is a flow chart of a method for approximating a magnitude of a complex number in accordance with various examples.

In some examples, the functionality of the comparison circuit 106 and the calculation circuit 108 is implemented by a hardware processor executing firmware or software (e.g., stored on a non-transitory computer-readable medium) that causes the hardware processor to provide such functionality. FIG. 5 a flow chart of a method 500 for approximating a magnitude of a complex number in accordance with various examples. In an example, the method 500 is carried out by a hardware processor responsive to executing instructions of such firmware or software.

The method 500 begins in block 502 with receiving a first digital input value (X) and a second digital input value (Y). As described above, a complex number includes a real part (I) and an imaginary part (Q). In an example, the digital values X and Y are provided based on a complex number. For example, X is the maximum of the absolute values of I and Q, while Y is the minimum of the absolute values of I and Q. Thus, X is the larger of the absolute values of I and Q, while Y is the smaller of the absolute values of I and Q. In cases where the absolute values of I and Q are equal, X and Y are also equal.

The method 500 continues in block 504 with determining a first digital output value that indicates one of a first relationship, a second relationship, and a third relationship between X and Y. In accordance with examples of this description, the first relationship corresponds to X being greater than 4Y, the second relationship corresponds to X being less than or equal to 4Y and 3X being greater than 5Y, and the third relationship corresponds to 3X being less than or equal to 5Y.

Responsive to the relationship being the first relationship in block 506, the method 500 continues to block 508 with providing a second digital output value that is a first linear combination of X and Y. Responsive to the relationship being the second relationship in block 506, the method 500 continues to block 510 with providing the second digital output value that is a second linear combination of X and Y. Responsive to the relationship being the third relationship in block 506, the method 500 continues to block 512 with providing the second digital output value that is a third linear combination of X and Y.

As explained above, the linear combinations of X and Y correspond to approximations of the magnitude of the complex number. In one example, the first, second, and third linear combinations are given by the following system of equations:

$$\begin{array}{ll} \dfrac{1}{1}X + \dfrac{13}{128}Y & X > 4Y \\[6pt] \dfrac{119X + 49Y}{128} & X <= 4Y\ \&\ X > 5Y \\[6pt] \dfrac{119X + 49Y}{128} & 3X <= 5Y \end{array}$$

The resulting approximation of the magnitude of the complex number (e.g., the second digital output value) has a reduced error relative to existing methods of approximation. Additionally, the method 500 is performed while maintaining an acceptable amount of latency (e.g., less than a latency threshold for a particular application), such as relative to computing the magnitude of a complex number by taking the square root of the sum of the squares of the real and imaginary parts of the complex number. In other examples, the method 500 determines one of more than three relationships between X and Y, and provides additional linear combinations as the second digital output value responsive to the relationship being one of the additional relationships, respectively.

As described above, the approximation of the magnitude of the complex number is useful in various systems, such as an FFT computation engine or a radar system. For example, the approximation of the magnitude of a complex number is useful to compute a magnitude in an FFT spectrum. In another example, the approximation of the magnitude of a complex number is useful in performing various radar operations, such as peak detection operations (e.g., constant false alarm rate (CFAR) detection) to determine the location and/or velocity of an object observed by the radar system.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A device, comprising:
    a comparison circuit including:
        a first shift circuit configured to shift a first digital input value (X) to provide a first output value that is a multiple of X;
        a second shift circuit configured to shift a second digital input value (Y) to provide a second output value that is a multiple of Y;
        a first adder configured to provide a first digital output value based on X and the second output value;
        a second adder configured to provide a third output value based on the first output value and X;
        a third adder configured to provide a fourth output value based on the second output value and Y; and
        a fourth adder configured to provide a second digital output value based on the third output value and the fourth output value; and
    a calculation circuit including shift circuitry coupled to the first and fourth adders, the shift circuitry configured to:
        receive X and Y;
    the calculation circuit further including a multiplexor coupled to the shift circuitry, the multiplexor:
        having a first input configured to receive a control input that includes a portion of each of the first digital output value and the second digital output value, a second input configured to receive a third digital output value that is a first linear combination of X and Y, a third input configured to receive a fourth digital output value that is a second linear combination of X and Y, and a fourth input configured to receive a fifth digital output value that is a third linear combination of X and Y; and having an output configured to provide as a multiplexor output value:

the third digital output value responsive to the portions of the first and second digital output values indicating a first relationship between X and Y;

the fourth digital output value responsive to the portions of the first and second digital output values indicating a second relationship between X and Y; and the fifth digital output value responsive to the portions of the first and second digital output values indicating a third relationship between X and Y.

2. The device of claim 1, wherein:

X is a maximum of an absolute value of a real part of a complex number and an absolute value of an imaginary part of the complex number; and Y is a minimum of the absolute value of the real part of the complex number and the absolute value of the imaginary part of the complex number.

3. The device of claim 2, wherein:

the first relationship is X being greater than or equal to 4Y;

the second relationship is X being less than or equal to 4Y and 3X being greater than 5Y; and the third relationship is 3X being less than or equal to 5Y.

4. The device of claim 3, wherein:

the first linear combination is $$X + \frac{13}{128}Y;$$

the second linear combination is $$\frac{119X + 49Y}{128};$$

and the third linear combination is $$\frac{100X + 81Y}{128}.$$

5. The device of claim 1, wherein:

the first digital output value is equal to 4*Y-X, wherein the portion of the first digital output value includes a most-significant bit (MSB) of the first digital output value;

the first output value is equal to 2X;

the second output value is equal to 4Y;

the third output value is equal to 3X;

the fourth output value is equal to 5Y; and the second digital output value is equal to 5Y-3X, wherein the portion of the second digital output value includes an MSB of the second digital output value.

6. The device of claim 5, wherein the calculation circuit comprises:

a fifth adder configured to provide to the multiplexor the third digital output value, which is equal to 128X+13Y;

a sixth adder configured to provide to the multiplexor the fourth digital output value, which is equal to 119X+49Y;

a seventh adder configured to provide to the multiplexor the fifth digital output value, which equal to 100X+81Y; and an output shifter configured to shift the multiplexor output value to provide a digital output value equal to the multiplexor output divided by 128.

7. The device of claim 5, further comprising a max/min circuit configured to:

receive a complex number including a real part and an imaginary part;

provide X to the comparison circuit, wherein X is a maximum of an absolute value of the real part and an absolute value of the imaginary part; and provide Y to the comparison circuit, wherein Y is a minimum of the absolute value of the real part and the absolute value of the imaginary part.

8. A method, comprising:

shifting, by a first shift circuit, a first digital input value (X) to provide a first output value that is a multiple of X;

shifting, by a second shift circuit, a second digital input value (Y) to provide a second output value that is a multiple of Y;

combining X and the second output value, by a first adder, to provide a first digital output value;

combining the first output value and X, by a second adder, to provide a third output value;

combining the second output value and Y, by a third adder, to provide a fourth output value;

combining the third output value and the fourth output value, by a fourth adder, to provide a second digital output value;

receiving by a multiplexor:

a control input that includes a portion of each of the first digital output value and the second digital output value;

a third digital output value that is a first linear combination of X and Y;

a fourth digital output value that is a second linear combination of X and Y; and a fifth digital output value that is a third linear combination of X and Y; and outputting, by the multiplexor, as a multiplexor output value:

the third digital output value responsive to the portions of the first and second digital output values indicating a first relationship between X and Y;

the fourth digital output value responsive to the portions of the first and second digital output values indicating a second relationship between X and Y; and the fifth digital output value responsive to the portions of the first and second digital output values indicating a third relationship between X and Y.

9. The method of claim 8, wherein:

X is a maximum of an absolute value of a real part of a complex number and an absolute value of an imaginary part of the complex number; and Y is a minimum of the absolute value of the real part of the complex number and the absolute value of the imaginary part of the complex number.

10. The method of claim 9, wherein:
the first relationship is X being greater than or equal to 4Y;
the second relationship is X being less than or equal to 4Y and 3X being greater than 5Y; and
the third relationship is 3X being less than or equal to 5Y.

11. The method of claim 10, wherein:
the first linear combination is $$X + \frac{13}{128}Y;$$

the second linear combination is $$\frac{119X + 49Y}{128};$$

and
the third linear combination is $$\frac{100X + 81Y}{128}.$$

12. The method of claim 8, wherein:
the first digital output value is equal to 4*Y-X, wherein the portion of the first digital output value includes a most-significant bit (MSB) of the first digital output value;
the first output value is equal to 2X;
the second output value is equal to 4Y;
the third output value is equal to 3X;
the fourth output value is equal to 5Y; and
the second digital output value is equal to 5Y−3X, wherein the portion of the second digital output value includes an MSB of the second digital output value.

13. The method of claim 12, further comprising:
providing, by a fifth adder, to the multiplexor, the third digital output value, which is equal to 128X+13Y;
providing, by a sixth adder, to the multiplexor, the fourth digital output value, which is equal to 119X+49Y;
providing, by a seventh adder, to the multiplexor, the fifth digital output value, which is equal to 100X+81Y; and
shifting the multiplexor output value to provide a digital output value equal to the multiplexor output value divided by 128.

14. The method of claim 8, further comprising computing a magnitude of a fast Fourier transform (FFT) spectrum responsive to the digital output value.

15. The method of claim 8, further comprising performing a peak detection operation in a radar system responsive to the digital output value.

16. A non-transitory, computer-readable medium containing instructions that, when executed by a processor, cause the processor to be configured to:
shift, by controlling shift circuitry, a first digital input value (X) to provide a first output value that is a multiple of X;
shift, by controlling the shift circuitry, a second digital input value (Y) to provide a second output value that is a multiple of Y;
combine, by controlling adder circuitry of the processor, the first output value and X to provide a third output value;
combine, by controller the adder circuitry, the second output value and Y to provide a fourth output value;
combine, by controlling the adder circuitry, the third output value and the fourth output value to provide a second digital output value; and
provide, by controlling calculation circuitry:
a third digital output value that is a first linear combination of X and Y;
a fourth digital output value that is a second linear combination of X and Y; and
a fifth digital output value that is a third linear combination of X and Y;
output, by a multiplexor of the calculation circuitry, as multiplexor output value:
the third digital output value responsive to portions of the first and second digital output values indicating a first relationship between X and Y;
the fourth digital output value responsive to portions of the first and second digital output values indicating a second relationship between X and Y; and
the fifth digital output value responsive to portions of the first and second digital output values indicating a third relationship between X and Y.

17. The non-transitory computer-readable medium of claim 16, wherein:
X is a maximum of an absolute value of a real part of a complex number and an absolute value of an imaginary part of the complex number; and
Y is a minimum of the absolute value of the real part of the complex number and the absolute value of the imaginary part of the complex number.

18. The non-transitory computer-readable medium of claim 17, wherein:
the first relationship is X being greater than or equal to 4Y;
the second relationship is X being less than or equal to 4Y and 3X being greater than 5Y; and
the third relationship is 3X being less than or equal to 5Y.

19. The non-transitory computer-readable medium of claim 18, wherein:
the first linear combination is $$X + \frac{13}{128}Y;$$

the second linear combination is $$\frac{119X + 49Y}{128};$$

and
the third linear combination is $$\frac{100X + 81Y}{128}.$$

* * * * *